(12) United States Patent
Kwon et al.

(10) Patent No.: US 8,872,550 B2
(45) Date of Patent: Oct. 28, 2014

(54) SIGNAL PROCESSING APPARATUS AND METHOD

(71) Applicant: Samsung Electronics Co., Ltd., Suwon-si (KR)

(72) Inventors: Ui Kun Kwon, Hwaseong-si (KR); Sang Joon Kim, Hwaseong-si (KR); Seung Keun Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/864,807

(22) Filed: Apr. 17, 2013

(65) Prior Publication Data

US 2013/0278318 A1  Oct. 24, 2013

(30) Foreign Application Priority Data

Apr. 19, 2012  (KR) ........................ 10-2012-0041057

(51) Int. Cl.
*H03K 5/153* (2006.01)
*G01R 19/04* (2006.01)
*H03K 5/01* (2006.01)

(52) U.S. Cl.
CPC . *H03K 5/01* (2013.01); *G01R 19/04* (2013.01)
USPC .............................. 327/58; 327/530; 327/531

(58) Field of Classification Search
USPC ............................................ 327/58, 530, 531
See application file for complete search history.

(56) References Cited

U.S. PATENT DOCUMENTS

| | | | |
|---|---|---|---|
| 4,864,167 A * | 9/1989 | McKibben et al. | 327/309 |
| 6,348,816 B1 * | 2/2002 | Havens et al. | 327/58 |
| 2010/0303099 A1 | 12/2010 | Rieken | |
| 2011/0157929 A1 | 6/2011 | Sun et al. | |

FOREIGN PATENT DOCUMENTS

| | | |
|---|---|---|
| KR | 10-2010-0098715 | 9/2010 |
| KR | 10-2011-0112921 | 10/2011 |

* cited by examiner

*Primary Examiner* — John Poos
(74) *Attorney, Agent, or Firm* — NSIP Law

(57) ABSTRACT

An apparatus and a method for processing a signal, and for estimating a point corresponding to a maximum slope from an envelope of an input signal, are provided. A signal processing apparatus includes an envelope detecting unit configured to detect an envelope of an input signal. The signal processing apparatus further includes a correcting unit configured to correct slopes, each of the slopes being between respective points of the envelope, based on information on a clipping interval of the envelope. The signal processing apparatus further includes an estimating unit configured to estimate a point, of the envelope, in which a corrected slope, among the corrected slopes, includes a maximum value.

20 Claims, 18 Drawing Sheets

FIG. 3
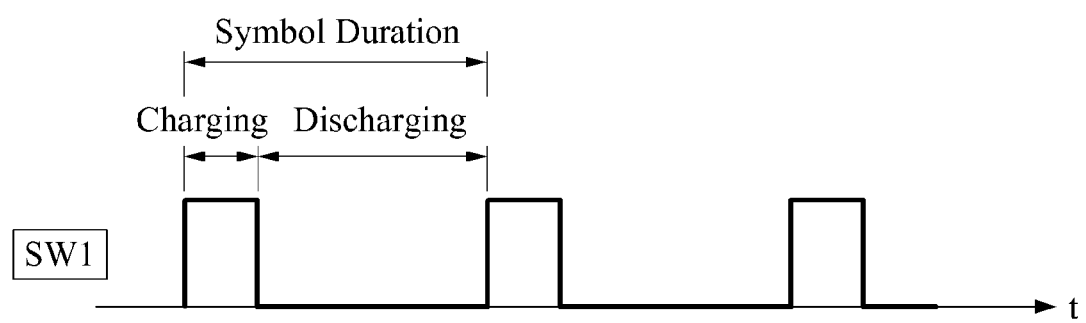
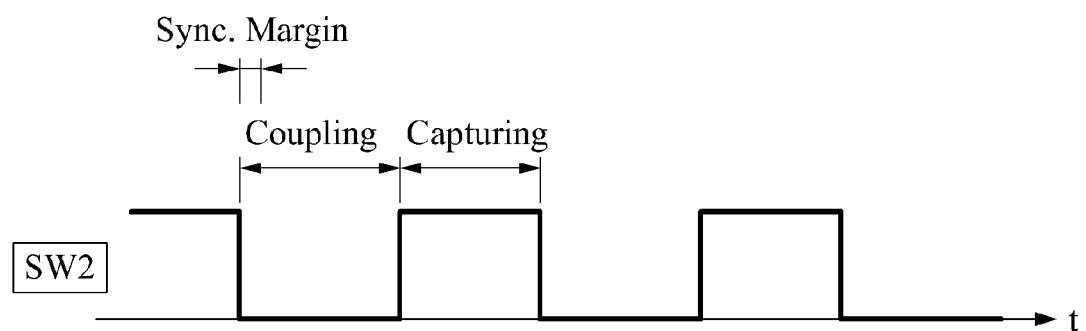

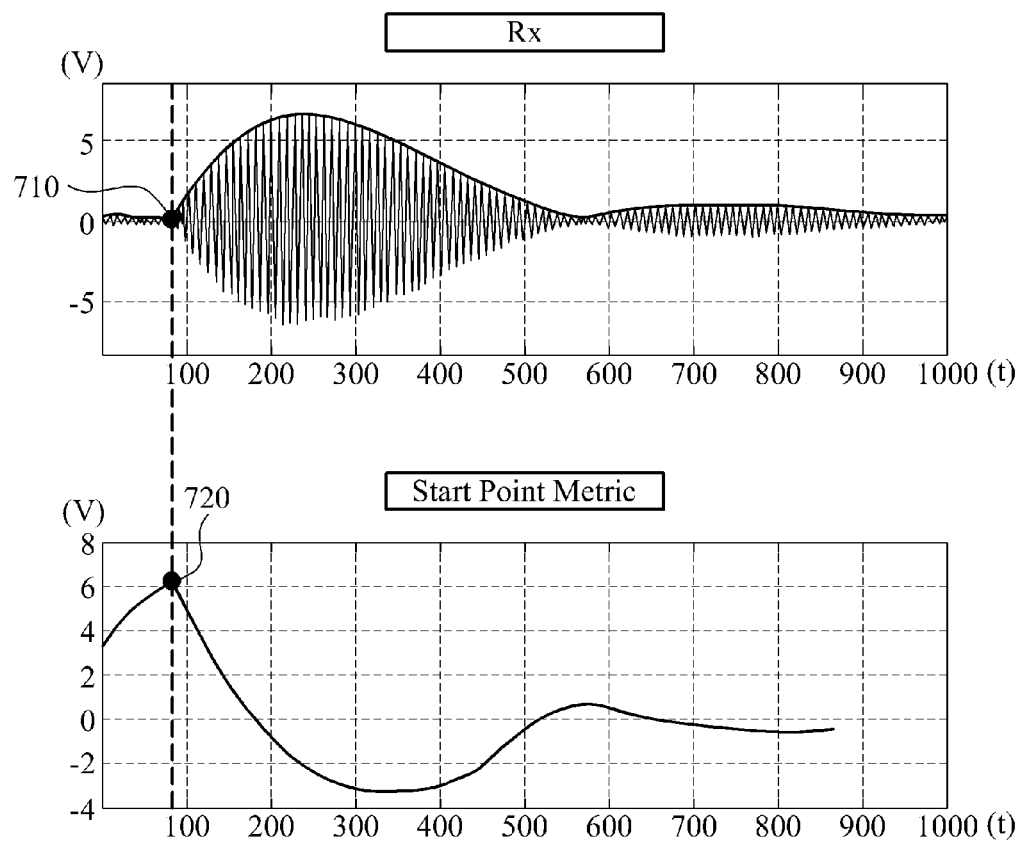

SIGNAL PROCESSING APPARATUS AND METHOD

CROSS-REFERENCE TO RELATED APPLICATION(S)

This application claims the benefit under 35 U.S.C. §119(a) of Korean Patent Application No. 10-2012-0041057, filed on Apr. 19, 2012, in the Korean Intellectual Property Office, the entire disclosure of which is incorporated herein by reference for all purposes.

BACKGROUND

1. Field

The following description relates to an apparatus and a method for processing a signal, and for estimating a point corresponding to a maximum slope from an envelope of an input signal.

2. Description of Related Art

Research on wireless power transmission has been conducted to overcome issues, such as an increasing inconvenience of wired power supply and limits to existing battery capacities, and due to an increase in various electronic devices including mobile devices. For example, research on near-field wireless power transmission has been conducted. The near-field wireless power transmission refers to an example in which a distance between a transmission coil and a reception coil is sufficiently short, compared to a wavelength in an operation frequency.

For example, a wireless power transmission and reception system using a resonance characteristic may include a source configured to supply wireless power, and a target configured to receive the supplied wireless power. When the wireless power is transmitted and received, the source and the target may need to share control information. Accordingly, there is a need for mutual synchronization between the source and the target to share the control information.

SUMMARY

In one general aspect, there is provided a signal processing apparatus including an envelope detecting unit configured to detect an envelope of an input signal. The signal processing apparatus further includes a correcting unit configured to correct slopes, each of the slopes being between respective points of the envelope, based on information on a clipping interval of the envelope. The signal processing apparatus further includes an estimating unit configured to estimate a point, of the envelope, in which a corrected slope, among the corrected slopes, includes a maximum value.

The envelope detecting unit may include an envelope estimator configured to estimate the envelope of the input signal, the input signal being clipped by a dynamic range of an analog-to-digital converter (ADC), and the dynamic range being set to be narrower than an amplitude of the input signal. The envelope detecting unit may further include a clipping unit configured to clip an amplitude of the estimated envelope in the clipping interval, to a clipping level corresponding to the dynamic range.

The envelope detecting unit may include an information acquiring unit configured to acquire the information on the clipping interval.

The correcting unit may include a slope calculating unit configured to calculate the slopes, each of the slopes being between two respective points including a predetermined gap, of the envelope.

The correcting unit may further include a gap adjusting unit configured to adaptively adjust the predetermined gap between the two respective points of each of the respective calculated slopes, based on the information on the clipping interval.

The gap adjusting unit may be further configured to adjust the predetermined gap between the two respective points of each of the respective calculated slopes to be greater than or equal to another predetermined gap.

The correcting unit may include a weight applying unit configured to apply a length of a non-clipping interval of the envelope to the slopes.

The estimating unit may be further configured to estimate the point, of the envelope, in which the corrected slope, among the corrected slopes, includes the maximum value based on a result of the application of the length of the non-clipping interval to the slopes.

The estimating unit may include a peak point estimator configured to estimate, for each symbol, a peak point including a maximum amplitude of the envelope in the clipping interval.

The signal processing apparatus may further include a control unit configured to control a target resonator to transfer power stored in the target resonator through a mutual resonance between a source resonator and the target resonator when the peak point is estimated.

The input signal may be clipped by a dynamic range of an ADC for each symbol. The input signal may include a waveform of power stored in a target resonator through a mutual resonance between a source resonator and the target resonator. The dynamic range may be set to be narrower than an amplitude of the waveform. The point may include a start point of the mutual resonance.

The input signal may include a waveform of a current applied to a target resonator, or a waveform of a voltage applied to the target resonator.

The signal processing apparatus may further include a control unit configured to control a target resonator to receive power through a mutual resonance between a source resonator and the target resonator when the point is estimated.

The envelope detecting unit may include a down-converting unit configured to multiply a predetermined signal of a resonance frequency by the input signal, to generate a down-converted signal, the input signal being ADC-sampled in a dynamic range. The envelope detecting unit may further include a transforming unit configured to perform discrete Fourier transform (DFT) or fast Fourier transform (FFT) on the down-converted signal, to transform the down-converted signal to a frequency-domain signal. The envelope detecting unit may further include a filtering unit configured to perform low-pass filtering (LPF) on the frequency-domain signal, to generate a filtered signal from which a harmonic component is removed. The envelope detecting unit may further include an inverse-transforming unit configured to perform inverse DFT (IDFT) or inverse FFT (IFFT) on the filtered signal, to transform the filtered signal to a time-domain signal. The envelope detecting unit may further include a clipping unit configured to clip an amplitude of the time-domain signal in the clipping interval, to a clipping level corresponding to the dynamic range.

The envelope detecting unit may further include a transforming unit configured to perform DFT or FFT on the input signal, to transform the input signal to a frequency-domain signal, the input signal being ADC-sampled in a dynamic range. The envelope detecting unit may further include a circular shift unit configured to circularly shift the frequency-domain signal by a predetermined frequency, to generate a circularly-shifted signal. The envelope detecting unit may further include a filtering unit configured to perform LPF on the circularly-shifted signal, to generate a filtered signal from which a harmonic component is removed. The envelope detecting unit may further include an inverse-transforming unit configured to perform IDFT or IFFT on the filtered signal, to transform the filtered signal to a time-domain signal. The envelope detecting unit may further include a clipping unit configured to clip an amplitude of the time-domain signal in the clipping interval, to a clipping level corresponding to the dynamic range.

In another general aspect, there is provided a signal processing method including detecting an envelope of an input signal. The signal processing method further includes correcting slopes, each of the slopes being between respective points of the envelope, based on information on a clipping interval of the envelope. The signal processing method further includes estimating a point, of the envelope, in which a corrected slope, among the corrected slopes, includes a maximum value.

The input signal may be clipped by a dynamic range of an analog-to-digital converter (ADC). The dynamic range may be set to be narrower than an amplitude of the input signal. The detecting may include clipping an amplitude of the envelope in the clipping interval, to a clipping level corresponding to the dynamic range.

The correcting may include calculating the slopes, each of the slopes being between two respective points including a predetermined gap in the envelope. The correcting may further include adaptively adjusting the predetermined gap between the two respective points of each of the respective calculated slopes based on the information on the clipping interval. The correcting may further include applying a length of a non-clipping interval of the envelope to the calculated slopes.

The estimating may include estimating the point, of the envelope, in which the corrected slope, among the corrected slopes, includes the maximum value based on a result of the applying of the length of the non-clipping interval to the calculated slopes.

Other features and aspects will be apparent from the following detailed description, the drawings, and the claims.

BRIEF DESCRIPTION OF THE DRAWINGS

FIG. 3 is a diagram illustrating an example of an operation timing of a switch of each of a transmitter and a receiver in a communication system using wireless power.

FIG. 7 is a graph illustrating an example of an envelope of an input signal, and an example of a slope value in each point of the envelope, in the example of FIG. 6.

Figure 1:
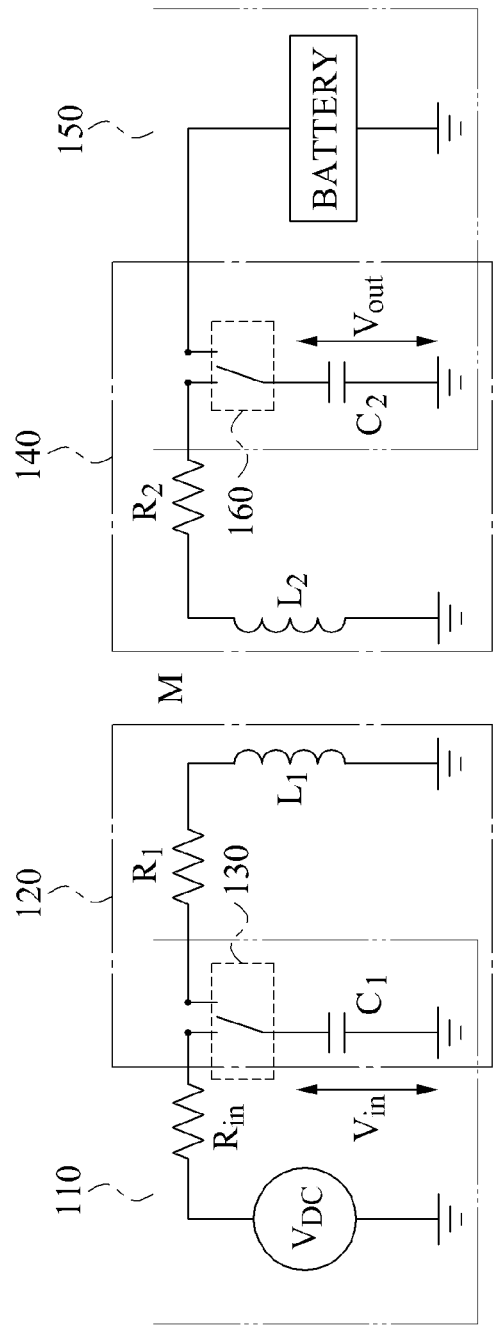
FIG. 1 is a diagram illustrating an example of an equivalent circuit of a communication system using wireless power.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses, and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, description of well-known functions and constructions may be omitted for increased clarity and conciseness.

A communication system using wireless power may be applied to various systems requiring wireless power transmission. The communication system may be used to exchange control information and/or other information between a transmitter and a receiver, in a system in which wireless power transmission is performed, for example, a mobile phone, a wireless television (TV), and/or other devices known to one of ordinary skill in the art. Additionally, the communication system may be applicable in a bio-healthcare field, and may be used to remotely transmit power to a device inserted into a human body, and/or a bandage-shaped device for measurement of a heart rate.

Further, the communication system may be used to remotely control an information storage device without a power source. The communication system may be applied to a system that is configured to supply power to an information storage device to remotely operate the information storage device, and to wirelessly request information stored in the information storage device.

The communication system may receive power supplied from a power supply unit, and may store the power in a source resonator, to generate a signal. The communication system may induce the source resonator to self-resonate by powering off a switch that electrically connects the power supply unit to the source resonator. For example, when a target resonator with the same resonance frequency as the source resonator is disposed within a distance close enough to resonate with the source resonator that self-resonates, a mutual resonance phenomenon may occur between the source resonator and the target resonator.

In the examples herein, the source resonator may include a resonator that receives the power from the power supply unit. The target resonator may include a resonator that receives the power from the source resonator due to the mutual resonance phenomenon.

FIG. 1 illustrates an example of an equivalent circuit of a communication system using wireless power. In the example of FIG. 1, the communication system includes a wireless power transmitting apparatus including a power input unit 110, a power transmitting unit 120, and a switch unit 130. The communication system further includes a wireless power receiving apparatus including a receiving unit 140, a power output unit 150, and a switch unit 160.

The power input unit 110 is physically separated from the power transmitting unit 120 by a capacitor $C_1$ and a switch, of the switch unit 130, and the receiving unit 140 is physically separated from the power output unit 150 by a capacitor $C_2$ and a switch, of the switch unit 160. The above-described communication system may be expressed as a resonator isolation (RI) system.

Referring to FIG. 1, the communication system includes a source-target structure including a source device and a target device. The communication system includes the wireless power transmitting apparatus corresponding to the source device, and the wireless power receiving apparatus corresponding to the target device. In various examples, a signal processing apparatus is used to synchronize the switch of the target device with the switch of the source device.

In more detail, the power input unit 110 includes a power supply unit, an internal resistor $R_{in}$, and the capacitor $C_1$, and the power transmitting unit 120 includes a resistor $R_1$, a transmission coil $L_1$, and the capacitor $C_1$. In FIG. 1, R, L, and C represent a resistance, an inductance, and a capacitance, respectively. The power input unit 110 stores energy in the capacitor $C_1$ using the power supply unit that supplies an input voltage $V_{DC}$, namely, a direct current (DC) voltage. An input voltage applied to the capacitor $C_1$, among the input voltage $V_{DC}$, is represented as $V_{in}$.

The switch unit 130 connects the capacitor $C_1$ to the power input unit 110, while the energy is being stored in the capacitor $C_1$. The switch unit 130 disconnects the capacitor $C_1$ from the power input unit 110, and connects the capacitor $C_1$ to the power transmitting unit 120, to discharge the energy stored in the capacitor $C_1$, to the power transmitting unit 120. The switch unit 130 prevents the capacitor $C_1$ from being connected to the power input unit 110 and the power transmitting unit 120 at the same time.

The switch unit 130 may include switches. For example, each of the switches may include an active element enabling an on/off function.

The power transmitting unit 120 transfers electromagnetic energy, or power, to the receiving unit 140 based on the energy discharged to the power transmitting unit 120. In the example of FIG. 1, the power transmitting unit 120 transfers the power through mutual resonance between the transmission coil $L_1$ and a reception coil $L_2$ of the receiving unit 140.

A level of the mutual resonance between the transmission coil $L_1$ and the reception coil $L_2$ is affected by a mutual inductance M.

In FIG. 1, the receiving unit 140 includes a resistor $R_2$, the reception coil $L_2$, and a capacitor $C_2$, and the power output unit 150 includes a load and the capacitor $C_2$. The receiving unit 140 receives the power from the power transmitting unit 120. In more detail, the reception coil $L_2$ of the receiving unit 140 receives the power through the mutual resonance with the transmission coil $L_1$ of the power transmitting unit 120. The receiving unit 140 stores the received power, or energy, in the capacitor $C_2$. That is, the received power is used to charge the capacitor $C_2$ connected to the reception coil $L_2$. An output voltage applied to the capacitor $C_2$, among the power received by the reception coil $L_2$, is represented as $V_{out}$.

The switch unit 160 connects the capacitor $C_2$ to the receiving unit 140, while the energy is being stored in the capacitor $C_2$. The switch unit 160 disconnects the capacitor $C_2$ from the receiving unit 140, and connects the capacitor $C_2$ to the power output unit 150, to transfer the energy stored in the capacitor $C_2$ to the load, for example, a battery or a target device. In other words, the power output unit 150 transfers the received power used to charge the capacitor $C_2$ to the load. The switch unit 160 prevents the capacitor $C_2$ from being connected to the receiving unit 140 and the power output unit 150 at the same time. The switch unit 160 may include switches.

The RI system enables power to be transmitted in an example in which the power input unit 110 is physically separated from the power transmitting unit 120, and the receiving unit 140 is physically separated from the power output unit 150. Accordingly, in comparison to a conventional power transmission method using impedance matching, the RI system does not need a power amplifier, because power may be supplied from a DC source (e.g., the power supply unit) directly to a source resonator (e.g., the power transmitting unit 120). Further, the RI system does not require a rectifying operation of a rectifier, because energy is captured from power used to charge a capacitor of a receiver in order to charge a battery. Moreover, in the RI system, a transmission efficiency is not sensitive to a change in a distance between a transmitter (e.g., the wireless power transmitting apparatus) and a receiver (e.g., the wireless power receiving apparatus), because there is no need to perform impedance matching. Additionally, the RI system may be easily extended to a wireless power transmission system including a plurality of transmitters and a plurality of receivers.

Figure 2:
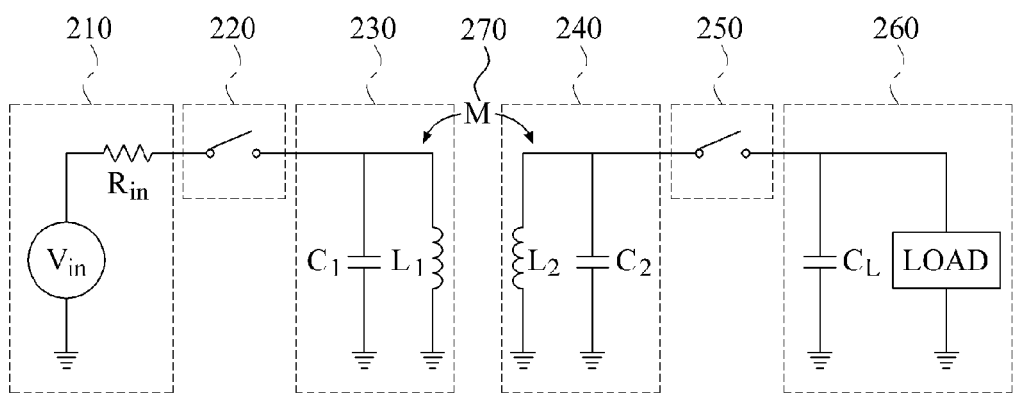
FIG. 2 is a diagram illustrating another example of an equivalent circuit of a communication system using wireless power.

FIG. 2 illustrates another example of an equivalent circuit of a communication system using wireless power. In this example, the communication system includes a wireless power transmitting apparatus including a power charging unit 210, a control unit 220, and a transmitting unit 230. The communication system further includes a wireless power receiving apparatus including a charging unit 240, a control unit 250, and a power output unit 260.

The power charging unit 210 is physically separated from the transmitting unit 230 by a switch of the control unit 220, and the charging unit 240 is physically separated from the power output unit 260 by a switch of the control unit 250. In other words, FIG. 2 illustrates another example of an RI system.

Referring to FIG. 2, the communication system includes a source-target structure including a source device and a target device. The communication system includes the wireless power transmitting apparatus corresponding to the source device, and the wireless power receiving apparatus corresponding to the target device. In various examples, a signal processing apparatus is used to synchronize the switch of the target device with the switch of the source device.

In more detail, the power charging unit 210 includes a power supply unit that supplies an input voltage $V_{in}$, and an internal resistor $R_{in}$. The transmitting unit 230 includes a capacitor $C_1$ and an inductor $L_1$, and may be referred to as a source resonator. The transmitting unit 230 transmits energy, or power, stored in the source resonator to the wireless power receiving apparatus, through mutual resonance between the source resonator and a target resonator, namely, the charging unit 240. The control unit 220 powers on (e.g., closes) a switch to enable the power to be supplied from the power charging unit 210 to the transmitting unit 230. In more detail, a voltage is applied from the power supply unit to the capacitor $C_1$, and a current is applied to the inductor $L_1$. For example, when the source resonator reaches a steady state, the voltage applied to the capacitor $C_1$ may include a value of 0, and the current flowing in the inductor $L_1$ may include a value of $V_{in}/R_{in}$. In the steady state, the source resonator is charged with the power using the current applied to the inductor $L_1$.

When the power used to charge the source resonator in the steady state reaches a predetermined value, the control unit 220 powers off (e.g., opens) the switch to separate the power charging unit 210 from the transmitting unit 230. The control unit 220 sets information on the predetermined value. When the switch is powered off, the source resonator starts self-resonating between the capacitor $C_1$ and the inductor $L_1$. The energy, or the power, stored in the source resonator is transferred to the target resonator, through mutual inductance M 270 between the source resonator and the target resonator. A resonance frequency $f_1$ of the source resonator may be the same as a resonance frequency $f_2$ of the target resonator ($f_1=f_2$). Additionally, the resonance frequencies $f_1$ and $f_2$ may be determined based on equations $$f_1 = \frac{1}{2\pi\sqrt{L_1 C_1}},$$

$$f_2 = \frac{1}{2\pi\sqrt{L_2 C_2}}.$$

In FIG. 2, the charging unit 240 includes a capacitor $C_2$ and an inductor $L_2$, and may be referred to as the target resonator. The power output unit 260 includes a load and a capacitor $C_L$. During the mutual resonance between the source resonator and the target resonator, the source resonator is separated from the power supply unit, and the target resonator is separated from the load and the capacitor $C_L$. The capacitor $C_2$ and the inductor $L_2$ is charged with the power received from the source resonator through the mutual resonance.

To charge the target resonator with the power, the control unit 250 powers off (e.g., opens) a switch to separate the charging unit 240 from the power output unit 260. When the switch is powered off, the source resonator and the target resonator resonate with each other, since the target resonator includes the same resonance frequency as the source resonator. When the power used to charge the target resonator reaches a predetermined value, the control unit 250 powers on (e.g., closes) the switch. The control unit 250 sets information on the predetermined value. By powering on the switch, the control unit 250 connects the capacitor $C_L$ to the charging unit 240, which changes the resonance frequency of the target resonator. A value of the changed resonance frequency $f_2'$ of the target resonator may be determined based on an equation $$f_2' = \frac{1}{2\pi\sqrt{L_2(C_2 + C_L)}}.$$

Accordingly, the mutual resonance between the source resonator and the target resonator is terminated. For example, when $f_2'$ is much smaller than $f_2$ based on a Q-factor of the target resonator, a mutual resonance channel is removed. When the switch is powered on, the power output unit 260 transfers the power used to charge the capacitor $C_2$ and the inductor $L_2$ to the load. For example, the power output unit 260 may transfer the power using a scheme based on the load.

When the power used to charge the target resonator is less than the predetermined value, the control unit 250 powers off the switch. When the switch is powered off, the charging unit 240 may recharge the target resonator with power using a mutual resonance between the source resonator and the target resonator.

During the mutual resonance between the source resonator and the target resonator, the switch of the control unit 250 is not connected to the power output unit 260. Accordingly, it is possible to prevent a transmission efficiency from being reduced due to a connection of the switch.

A scheme of FIG. 2 of controlling a point in time of capturing energy stored in a target resonator may be performed more easily than a scheme of FIG. 1 of capturing energy stored in a capacitor. This is because, in the scheme of FIG. 1, only the energy stored in the capacitor is captured. However, in the scheme of FIG. 2, the energy stored in an inductor and a capacitor, of the target resonator, is captured. Accordingly, in the scheme of FIG. 2, a degree of freedom for the point in time of capturing the energy may be improved.

To transmit power or data, a transmitter (e.g., the wireless power transmitting apparatus) in a RI system may repeatedly charge a source resonator with energy, and discharge the energy through a connection to a switch. In various examples herein, a single charge and discharge of energy may be expressed as a single symbol, e.g., duration of time. To receive the power or the data from the transmitter, a receiver (e.g., the wireless power receiving apparatus) in the RI system may operate a switch of the receiver based on an operation period of the switch of the transmitter that repeatedly performs the charging and the discharging.

Accordingly, to receive the power or the data from the transmitter without an error, the receiver may need to know when the switch of the transmitter is powered off, when the switch of the transmitter is powered on, when a mutual resonance between the source resonator and a target resonator of the transmitter is started, and when energy stored in the target resonator includes a peak value. An method of acquiring information regarding an on/off time of the switch of the transmitter, and of matching an on/off time of the switch of the receiver to the acquired information, may be expressed as time synchronization.

FIG. 3 illustrates an example of an operation timing of a switch of each of a transmitter and a receiver in a communication system using wireless power. Referring to FIG. 3, the transmitter transmits energy to the receiver by repeatedly charging and discharging a source resonator of the transmitter with energy. The transmitter repeatedly charges and discharges the source resonator by powering on and off, respectively, a switch SW1 of the transmitter. In various examples herein, a single charge and discharge of energy may be expressed as a single symbol, e.g., a duration of time.

To receive the energy from the transmitter, the receiver powers off a switch SW2 of the receiver, and prepares mutual resonance with the transmitter, prior to a predetermined duration of time (namely, a synchronization margin) in which the charging of the source resonator of the transmitter is switched to the discharging of the source resonator due to the powering off of the switch SW1 of the transmitter. When the mutual resonance is started, a target resonator of the receiver is charged with the energy. The mutual resonance may be expressed as coupling between the source resonator and the target resonator.

The receiver powers on the switch SW2 at a point in time in which the energy stored in the target resonator includes a peak value, and changes a resonance frequency of the target resonator to be different from a resonance frequency of the source resonator, to capture the energy stored in the target resonator. These operations of the receiver may be expressed as capturing. To perform the coupling and the capturing, the receiver needs to know information on an operation of the switch SW1 of the transmitter.

Figure 4:
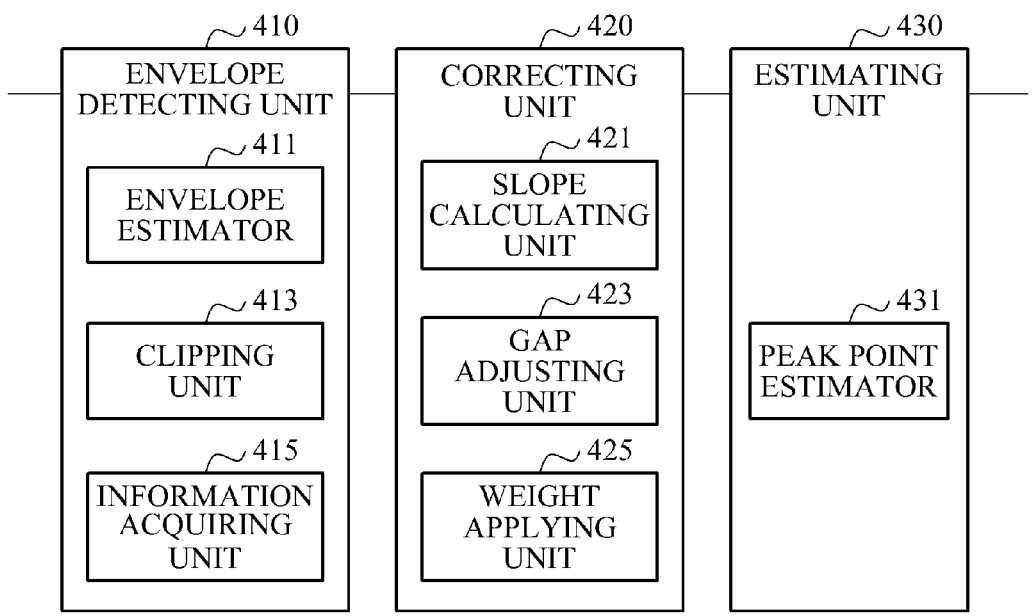
FIG. 4 is a block diagram illustrating an example of a signal processing apparatus.

FIG. 4 illustrates an example of a signal processing apparatus. Referring to FIG. 4, the signal processing apparatus includes an envelope detecting unit 410, a correcting unit 420, and an estimating unit 430. The signal processing apparatus may be used in a receiver of a RI system, to perform time synchronization between a switch of the receiver and a switch of a transmitter.

The envelope detecting unit 410 detects an envelope of a clipped signal. The envelope includes an envelope of an input signal that is clipped during sampling of an analog-to-digital converter (ADC). For example, when a dynamic range of the ADC is narrower than an amplitude of the input signal, clipping of the input signal occurs during the sampling.

The input signal may include a waveform of energy exchanged between a source resonator and a target resonator in a RI system. In addition, the input signal may include, for example, an audio signal, an image signal, a bio-signal, and/or other signals known to one of ordinary skill in the art.

As illustrated in FIG. 4, the envelope detecting unit 410 includes an envelope estimator 411, a clipping unit 413, and an information acquiring unit 415. The envelope estimator 411 estimates an envelope of the input signal clipped by the dynamic range of the ADC. The dynamic range of the ADC is set to be narrower than the amplitude of the input signal. The clipping unit 413 clips an amplitude value of the envelope estimated by the envelope estimator 411 in a clipping interval, to a clipping level corresponding to the dynamic range. In various examples, the clipping interval is expressed as an interval of the envelope in which the clipping occurs, and a non-clipping interval is expressed as an interval of the envelope in which the clipping does not occur. Since the envelope estimated by the envelope estimator 411 includes the amplitude value greater than the clipping level in the clipping interval, the clipping unit 413 clips the amplitude value of the estimated envelope in the clipping interval, to the clipping level.

The information acquiring unit 415 acquires information on the clipping interval caused by the dynamic range of the ADC. The clipping unit 413 acquires the information on the clipping interval from the information acquiring unit 415, and performs the clipping based on the information on the clipping interval.

The correcting unit 420 also acquires the information on the clipping interval from the information acquiring unit 415. The correcting unit 420 determines slopes, each of which is between respective points or point pairs of the detected envelope, and may correct the calculated slopes. The correcting unit 420 may correct the calculated slopes based on the information on the clipping interval. The slopes calculated regardless of the clipping may need to be corrected due to similar values of the slopes in a single symbol. An example of the slopes calculated regardless of the clipping is further illustrated in FIG. 9B.

As illustrated in FIG. 4, the correcting unit 420 includes a slope calculating unit 421, a gap adjusting unit 423, and a weight applying unit 425. The slope calculating unit 421 calculates the slopes, each of which is between two points including a predetermined gap (e.g., distance therebetween) of the envelope detected by the envelope detecting unit 410. The predetermined gap may be constant, or may be adaptively adjusted when one of the two points is located in the clipping interval. Additionally, the slope calculating unit 421 may calculates slopes of respective tangents each of which is of two points of the detected envelope. Calculated slope values may be represented by a graph as shown in a start point metric of FIG. 6.

To correct each of the calculated slopes, the gap adjusting unit 423 may adaptively adjust a respective predetermined gap between two points used to calculate a slope based on the information on the clipping interval. For example, when one of the two points is located in the clipping interval, the gap adjusting unit 423 may adjust (e.g., decrease) the predetermined gap so that the two points are closer to each other. In this example, the gap adjusting unit 423 may adjust the predetermined gap to prevent the two points from being included in the clipping interval.

Additionally or alternatively, the gap adjusting unit 423 may adjust the predetermined gap to be greater than or equal to a gap that is determined in advance. The determined gap may be determined based on a level of performance degradation due to noise occurring in the detected envelope. For example, the determined gap may be set to a gap in which the level of performance degradation is about 10% of a most severe level of performance degradation due to noise. This is because performance degradation may occur when a sensitivity to noise is increased due to a very narrow gap between the two points. For example, the gap adjusting unit 423 may adjust the predetermined gap between the two points to be greater than or equal to 50% of a gap that is initially set.

To further correct each of the calculated slopes, the weight applying unit 425 may set a length of the non-clipping interval as a weight, and may apply the length of the non-clipping interval to the slopes calculated by the slope calculating unit 421. For example, when the slopes are calculated, a high peak value may be obtained an undesired (e.g., non-clipping) point of the detected envelope. The weight applying unit 425 may multiply the length of the non-clipping interval by the calculated slopes, to reduce the high peak value obtained at the undesired point. For example, when the non-clipping interval includes a short length, and when the high peak value is obtained in the non-clipping interval, the short length is multiplied by the calculated slopes, to reduce the high peak value.

The weight applying unit 425 may use a width of a non-clipped index window as a weight. The non-clipped index window may include a window in which the clipping interval and the non-clipping interval are represented by '0,' and '1,' respectively. The width of the non-clipped index window may include the length of the non-clipping interval.

The estimating unit 430 estimates a point, of the envelope, in which a corrected slope, among the corrected slope, includes a maximum value, as a start point of a mutual resonance between a source resonator and a target resonator in a RI system. That is, a start point metric indicating corrected slopes may include a single peak value in a single symbol. The estimating unit 430 may estimate the point including the single peak value as the start point. The estimating unit 430 may estimate the point, of the envelope, in which the corrected slope includes the maximum value based on a result of the applying of the weight to the calculated slopes.

The estimating unit 430 includes a peak point estimator 431, as illustrated in FIG. 4. The peak point estimator 431 estimates, for each symbol, a peak point of the detected envelope that includes a peak value of the detected envelope in the clipping interval. That is, the peak point includes a point at which the detected envelope includes a maximum amplitude in the clipping interval, in an example in which clipping of the detected envelope does not occur, e.g., in the non-clipped envelope. In an RI system, a receiver may control a switch connected to a target resonator based on the peak point, e.g., may determine whether a mutual resonance with a transmitter is to be performed, or whether capturing is to be performed, based on whether the peak point is estimated.

For example, the detected envelope may be highly likely to include the peak value in the clipping interval. Accordingly, the peak point estimator 431 may estimate the peak point to include a predetermined point of the detected envelope in the clipping interval. For example, the peak point estimator 431 may estimate the peak point to include a point corresponding to a middle of the clipping interval, or a point that is earlier by a predetermined time than the point corresponding to the middle of the clipping interval.

Figure 5:
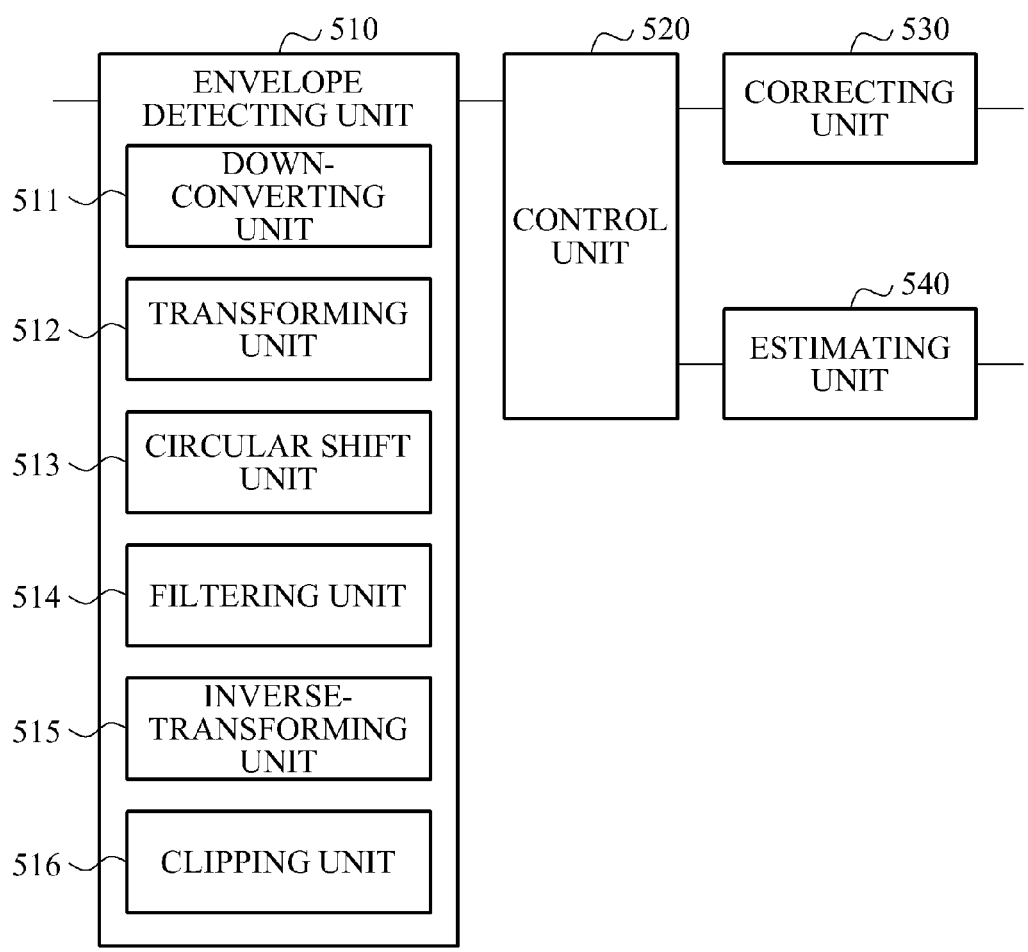
FIG. 5 is a block diagram illustrating another example of a signal processing apparatus.

FIG. 5 illustrates another example of a signal processing apparatus. Referring to FIG. 5, the signal processing apparatus includes an envelope detecting unit 510, a control unit 520, a correcting unit 530, and an estimating unit 540. The signal processing apparatus may be used in a receiver of a RI system, to perform time synchronization between a switch of the receiver and a switch of a transmitter. The envelope detecting unit 510, the correcting unit 530, and the estimating unit 540 may be implemented by the envelope detecting unit 410, the correcting unit 420, and the estimating unit 430, respectively, of FIG. 4.

The envelope detecting unit 510 detects an envelope of an input signal clipped by a dynamic range of an ADC, for each symbol. The input signal may include a waveform of energy stored in a target resonator of the receiver, through a mutual resonance between a source resonator and the target resonator. The dynamic range is set to be narrower than an amplitude of the waveform. The envelope detecting unit 510 clips an amplitude value of the detected envelope in the clipping interval, to a clipping level corresponding to the dynamic range.

The correcting unit 530 calculates slopes, each of which is between respective points or point pairs of the envelope detected by the envelope detecting unit 510, and may correct the calculated slopes based on information on the clipping interval. To correct each the calculated slopes, the correcting unit 530 may adaptively adjust a respective gap between two points used to calculate a slope, based on the information on the clipping interval. To further correct each the calculated slopes, the correcting unit 530 may set a length of a non-clipping interval as a weight, and may apply the length of the non-clipping interval to the calculated slopes.

The estimating unit 540 estimates a point, of the envelope, in which a corrected slope, among the corrected slopes, includes a maximum value, as a start point of the mutual resonance between a source resonator and a target resonator in a RI system. Accordingly, the corrected slope of the detected envelope includes the maximum value at a point in time in which the mutual resonance between a transmitter configured to transmit wireless power and a receiver configured to receive wireless power is started. The estimating unit 540 may estimate the start point of the mutual resonance based on an equation $$\text{signal\_start\_point} = \max_i \{\text{envelope}(i + \text{gap}) - \text{envelope}(i)\}.$$

In the above equation, signal_start_point denotes the start point of the mutual resonance, i denotes a point of the envelope, and gap denotes a gap between two points of the envelope. When a first point of the two points is located in the clipping interval, the gap may be adjusted to prevent the first point from being located in the clipping interval. In another example, signal_start_point may be estimated to be i with a maximum slope between two points including a predetermined gap in the envelope.

An amount of energy stored in the target resonator may be detected through sampling of the ADC in the current or the voltage. To accurately detect the amount of the energy, an ADC sampling rate may be sufficiently higher than a resonance frequency of the target resonator. When the ADC sampling rate is increased, an amount of power consumed in the ADC may be increased. Additionally, an energy transmission efficiency and a data transmission efficiency may be affected by the ADC sampling rate and a number of quantization bits. The number of quantization bits may be expressed as a resolution. Accordingly, the envelope detecting unit 510 may accurately detect the amount of the energy stored in the target resonator using an appropriately high ADC sampling rate.

The envelope detecting unit 510 may detect the envelope of the clipped signal from a waveform of a current applied to the target resonator, or a waveform of a voltage applied to the target resonator. The waveform of the energy stored in the target resonator may include the waveform of the current, or the waveform of the voltage. The envelope detecting unit 510 may include an analog envelope detection circuit that receives the current or the voltage as an input, and detects the envelope as an output based on the current or the voltage. That is, the analog envelope detection circuit receives the current or the voltage as the input, and detects an envelope of the current, or an envelope of the voltage, as the output. The analog envelope detection circuit may be implemented, for example, as a diode, a capacitor, and a load.

The envelope detecting unit 510 performs signal processing on the current or the voltage, and detects the envelope based on the signal processing. As illustrated in FIG. 5, the envelope detecting unit 510 includes a down-converting unit 511, a transforming unit 512, a circular shift unit 513, a filtering unit 514, an inverse-transforming unit 515, and a clipping unit 516.

The down-converting unit 511 multiplies one of predetermined signal waveforms of a resonance frequency to the input signal that is ADC-sampled in the dynamic range from the waveform of the voltage or the waveform of the current, to generate a down-converted signal. The predetermined signal waveforms may include, for example, a sine waveform, a cosine waveform, and an exponential waveform, in association with the resonance frequency. As a down-conversion scheme, a scheme used in communication may typically be used. For example, the down-converting unit 511 may down-convert the ADC-sampled input signal to a baseband signal.

The transforming unit 512 performs discrete Fourier transform (DFT) or fast Fourier transform (FFT) on the down-converted signal to transform the down-converted signal to a frequency-domain signal. The filtering unit 514 may perform low-pass filtering (LPF) on the frequency-domain signal to generate a signal from which a harmonic component is removed. The harmonic component may include a noise component included in the frequency-domain signal.

The inverse-transforming unit 515 performs inverse DFT (IDFT) or inverse FFT (IFFT) on the signal generated by the filtering unit 514 to transform the signal to a time-domain signal. The time-domain signal may include the envelope of the waveform of the current, or the envelope of the waveform of the voltage. The clipping unit 516 clips the amplitude value of the time-domain signal in the clipping interval, to the clipping level corresponding to the dynamic range of the ADC.

In another example, the circular shift unit 513 circularly shifts the frequency-domain signal generated by the transforming unit 512 by a predetermined frequency. For example, the circular shift unit 513 may circularly shift the frequency-domain signal to a baseband signal. The filtering unit 514 may perform LPF on the circularly shifted signal, to generate a signal from which the harmonic component is removed, and outputs the signal to the inverse-transforming unit 515. When the circular shift unit 513 circularly shifts the frequency-domain signal by the predetermined frequency, the filtering unit 514 performs the filtering smoothly.

In still another example, the filtering unit 514 may perform LPF on the down-converted signal generated by the down-converting unit 511 through a convolution in a time domain, to generate a signal from which the harmonic component is removed. In other words, the filtering unit 514 may perform LPF in a frequency domain, as well as, in the time domain. In this example, the signal from which the harmonic component is removed, may include the envelope of the waveform of the current, or the envelope of the waveform of the voltage. The filtering unit 514 outputs the signal from which the harmonic component is removed to the inverse-transforming unit 515.

In various examples, the envelope detecting unit 510 may detect an envelope from the waveform of the voltage, or the waveform of the current, using various signal processing schemes in a digital domain.

A state prior to mutual resonance between a target resonator and a source resonator may be expressed as an idle listen state, and may include a state in which the mutual resonance is prepared. For example, when the source resonator transmits energy in the idle listen state, the control unit 520 maintains the target resonator in an active state so that the target resonator directly receives the energy through the mutual resonance. The maintaining of the target resonator in the active state includes maintaining the target resonator in a self-resonance state. For example, when the switch is powered on in the wireless power receiving apparatus of FIG. 1, or when the switch is powered off in the wireless power receiving apparatus of FIG. 2, the target resonator is maintained in the active state.

The control unit 520 enables the target resonator to perform the mutual resonance from the estimated start point of the mutual resonance. Additionally, the control unit 520 captures the energy stored in the target resonator from a detected peak point, and enables the captured energy to be transferred to a load.

The control unit 520 controls a switch connected to the target resonator, based on time synchronization between the target resonator and the source resonator. For example, the control unit 520 controls the switch to be powered on in the wireless receiving apparatus of FIG. 1, and controls the switch to be powered off in the wireless receiving apparatus of FIG. 2, from the estimated start point of the mutual resonance. After the estimated start point, the receiver receives information using the energy stored in the target resonator.

Additionally, the control unit 520 controls switch to be powered off in the wireless receiving apparatus of FIG. 1, and controls the switch to be powered on in the wireless receiving apparatus of FIG. 2, from the detected peak point. This enables the energy stored in the target resonator to be transferred to the load.

The control unit 520 controls an overall operation of the signal processing apparatus of FIG. 5, and may perform functions of the envelope detecting unit 510, the correcting unit 530, and the estimating unit 540. To individually describe the functions of the envelope detecting unit 510, the control unit 520, the correcting unit 530, and the estimating unit 540, the envelope detecting unit 510, the control unit 520, the correcting unit 530, and the estimating unit 540 are separately illustrated in FIG. 5. However, when the signal processing apparatus of FIG. 5 is actually implemented, the control unit 520 may be configured to perform all of the functions, or only a portion of the functions.

Figure 6:
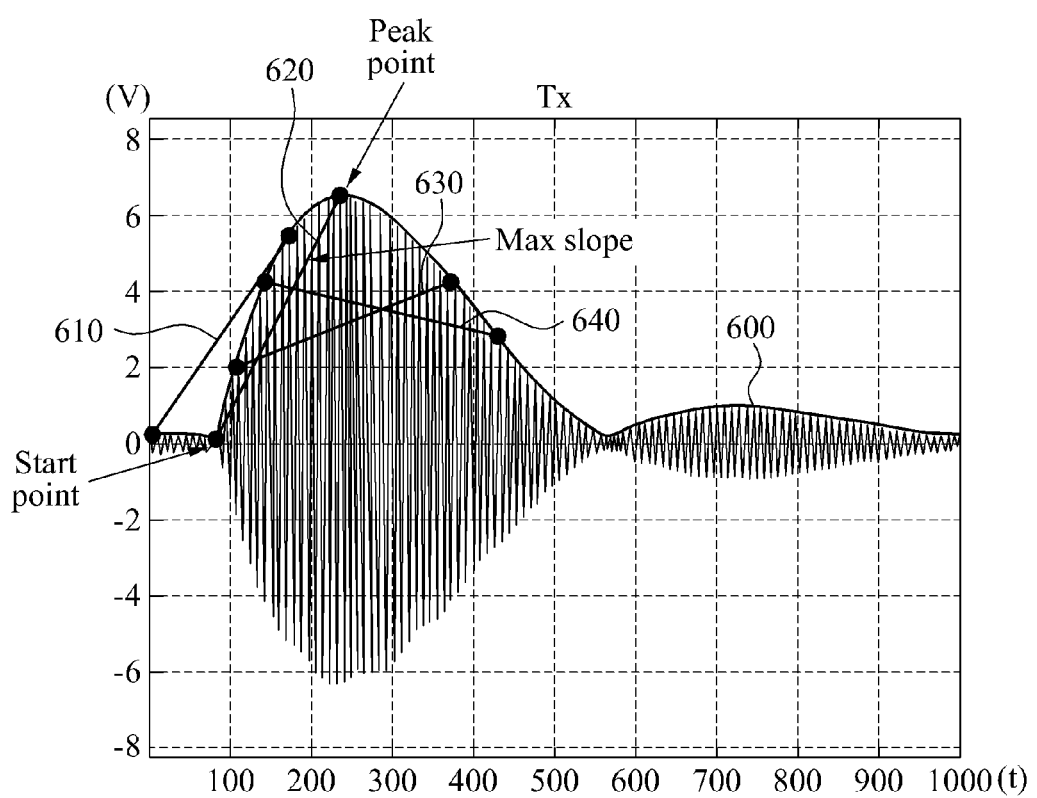
FIG. 6 is a graph illustrating examples of slopes of an envelope of an input signal that are calculated by a signal processing apparatus when a dynamic range of an analog-to-digital converter (ADC) is set to be greater than or equal to an amplitude of the input signal.

FIG. 6 illustrates examples of slopes of an envelope of an input signal that are calculated by a signal processing apparatus when a dynamic range of an analog-to-digital converter (ADC) is set to be greater than or equal to an amplitude of the input signal. Since the dynamic range of the ADC is set to be greater than or equal to the amplitude of the input signal, clipping of the input signal may not occur during sampling of the input signal. Referring to FIG. 6, the signal processing apparatus calculates each slope between two points including a predetermined gap, in an envelope 600 (e.g., Tx) detected from a waveform of the input signal. FIG. 6 illustrates four slopes 610, 620, 630, and 640. The slope 620 includes a maximum value, and accordingly, the slope 620 includes a start point at which a mutual resonance between a source resonator and a target resonator in a RI system is started. That is, since the slope 620 includes a maximum slope of the envelope 600, a front point among two points including a predetermined gap, of the slope 620, is estimated as the start point of the mutual resonance.

Also, since the slope 620 includes the maximum slope of the envelope 600, the slope 620 includes a peak point at which energy stored in the target resonator includes a peak value, and a wireless power receiving apparatus of the RI system captures the stored energy. The target resonator performs the mutual resonance with the source resonator between the start point of the mutual resonance and the peak point.

FIG. 7 illustrates an example of an envelope of an input signal, and an example of a slope value in each point of the envelope, in the example of FIG. 6. Referring to FIG. 7, a start point 710 of a mutual resonance in the envelope (e.g., Rx) of the input signal (e.g., a waveform of voltage applied to a target resonator in a receiver of a RI system), is aligned with a point 720 in which the slope value (e.g., a start point metric) of the envelope includes a maximum value. In other words, the point 720 is estimated as the point 710. The start point metric refers to a graph representing values of slopes, each of which is between two points including a predetermined gap, in the envelope 600 of FIG. 6.

Figure 8A:
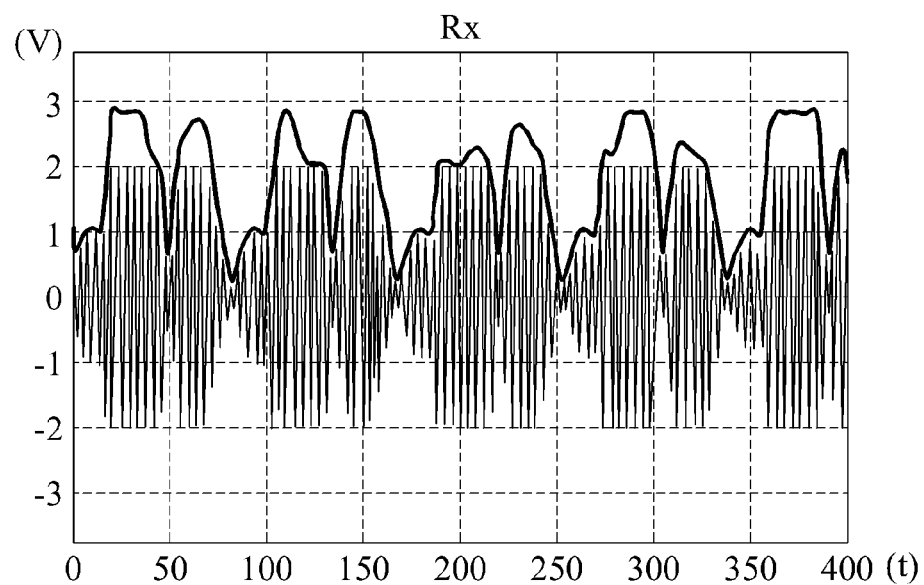
FIGS. 8A and 8B are graphs illustrating an example of an envelope of a clipped signal that is estimated by a signal processing apparatus, and an example of a result of clipping of the envelope in the signal processing apparatus, respectively.
Figure 8B:
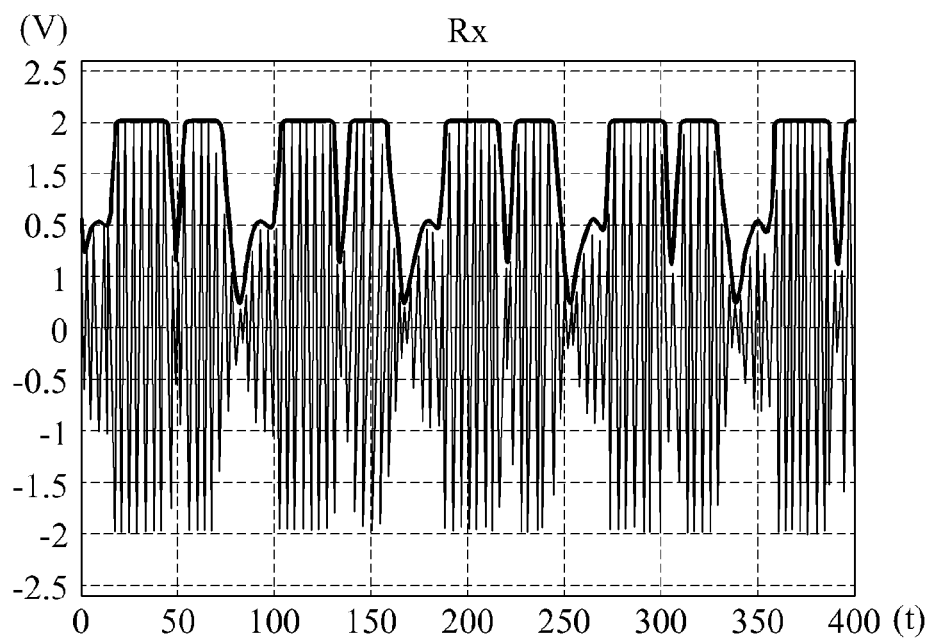

FIGS. 8A and 8B illustrate an example of an envelope of a clipped signal that is estimated by a signal processing apparatus, and an example of a result of clipping of the envelope in the signal processing apparatus, respectively. In more detail, FIG. 8A illustrates the example of the envelope (e.g., Rx) estimated from the clipped signal when a dynamic range of an ADC is set to be less than an amplitude of the clipped signal. FIG. 8B illustrates the example of the result (e.g., Rx) of the clipping of an amplitude of a clipping interval in the estimated envelope of FIG. 8A to a clipping level of 2 V. The dynamic range of the ADC is set to be a range of +2V to −2V.

Figure 9A:
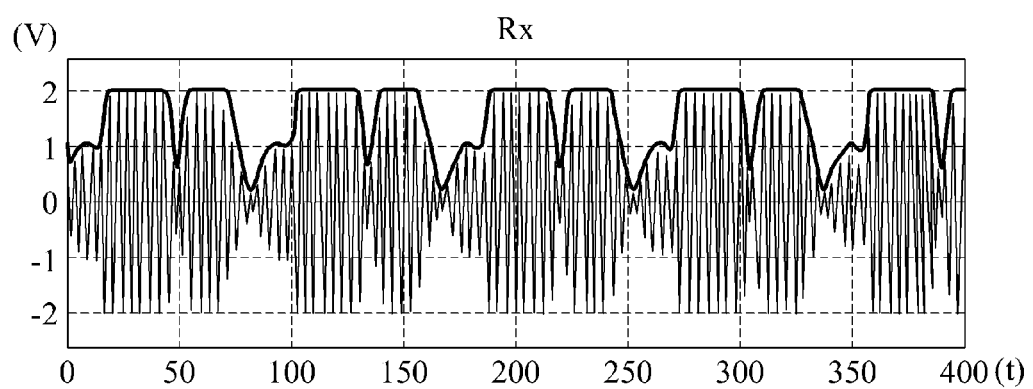
FIGS. 9A and 9B are graphs illustrating an example of a clipped envelope of a clipped signal, and an example of slope values calculated in points of the clipped envelope, respectively, in a signal processing apparatus.
Figure 9B:
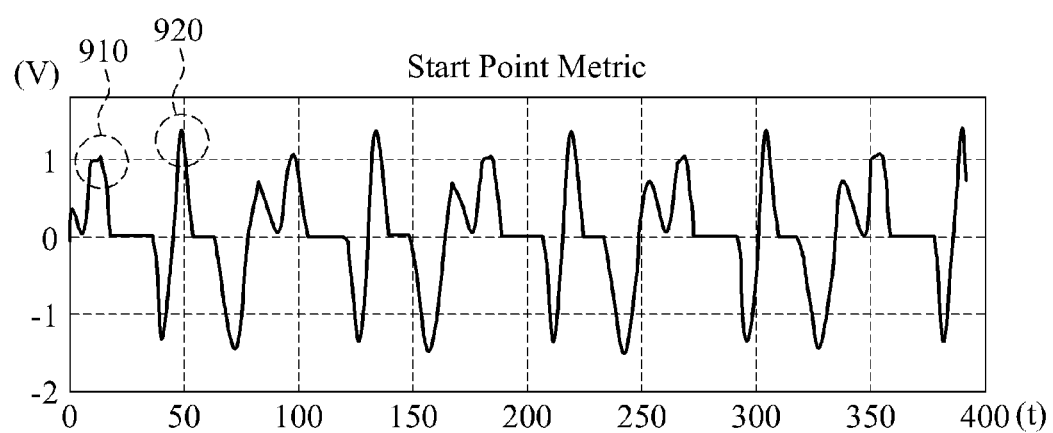

FIGS. 9A and 9B illustrate an example of a clipped envelope of a clipped signal, and an example of slope values calculated in points of the clipped envelope, respectively, in a signal processing apparatus. FIGS. 9A and 9B illustrate an example in which a receiver of a RI system, namely, a receiving (Rx) end, receives energy through a mutual resonance between a source resonator and a target resonator. In an example in which a value of each slope between two points including a predetermined gap, in the clipped envelope of FIG. 9A is calculated, a start point metric of FIG. 9B is obtained. In the start point metric of FIG. 9B, peaks 910 and 920 occur within a single symbol. The peak 910 is blunt due to clipping of the input signal, and a plurality of points include the peak 910. In more detail, at the peak 910, a slope value is not increased at a point in time in which the slope value needs to be increased, due to the clipping of the input signal. Meanwhile, the peak 920 occurs at an undesired point.

Figure 10A:
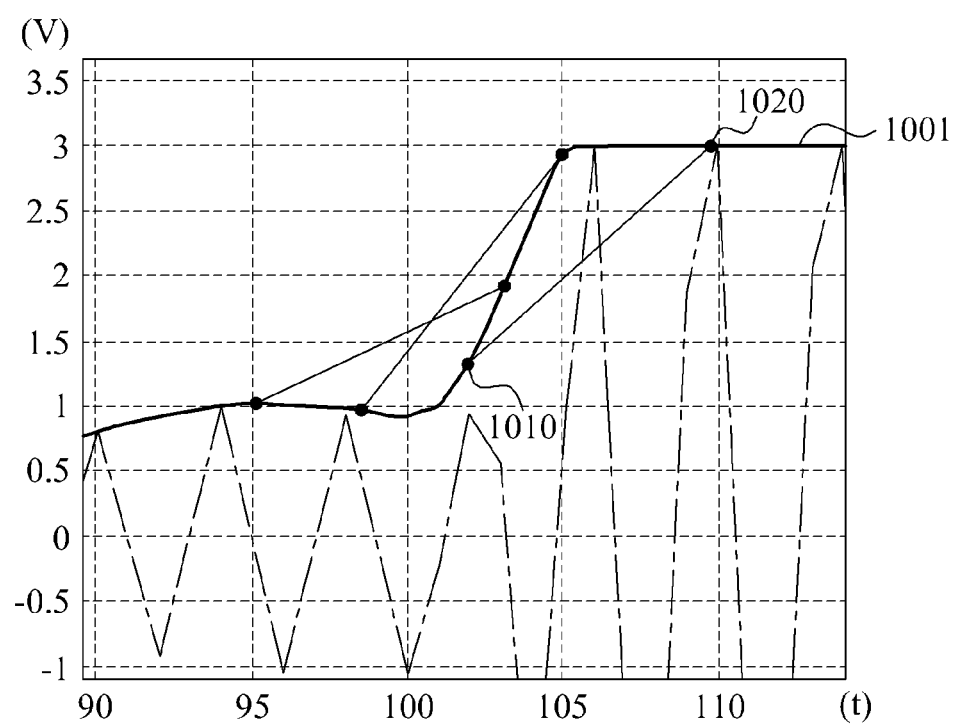
FIGS. 10A and 10B are graphs illustrating an example of an operation of adaptively adjusting a gap between two points used to calculate a slope, based on a clipping interval, in a signal processing apparatus.
Figure 10B:
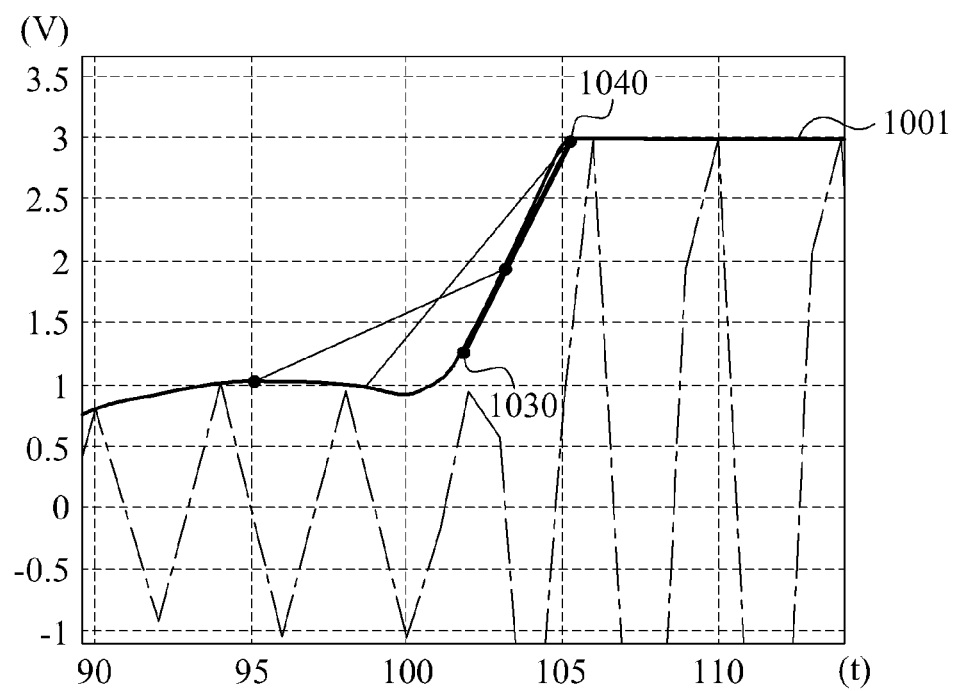

The peak 910 may be corrected by adaptively adjusting the gap between the two points used to calculate each slope, using an operation of FIGS. 10A and 10B. To enable the peak 920 to be smaller than the peak 910, a non-clipped index window of FIG. 12 may be used.

FIGS. 10A and 10B illustrate an example of an operation of adaptively adjusting a gap between two points used to calculate a slope, based on a clipping interval, in a signal processing apparatus. As illustrated in FIGS. 10A and 10B, in an example in which a point 1020 is located in a clipping interval 1001, the signal processing apparatus adjusts the point 1020 to a point 1040 before a point at which clipping occurs, without adjusting a point 1010 corresponding to a point 1030. Information on the clipping interval 1001 may be acquired during ADC sampling. In this example, the points 1010 and 1020 is used to calculate a slope.

In other words, a gap between the points 1010 and 1020 is adjusted to be a gap between the points 1030 and 1040. Accordingly, a gap between two points used to calculate a slope may be adaptively adjusted, to prevent one of the two points from being located in a clipping interval.

Figure 11A:
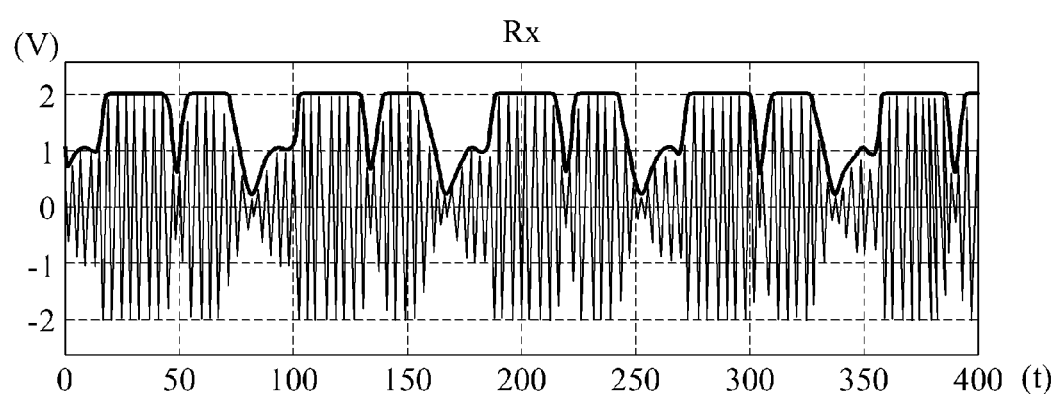
FIGS. 11A and 11B are graphs illustrating an example of a clipped envelope of a clipped signal, and an example of a result of adaptively adjusting a gap between two points used to calculate each slope, respectively, in a signal processing apparatus.
Figure 11B:
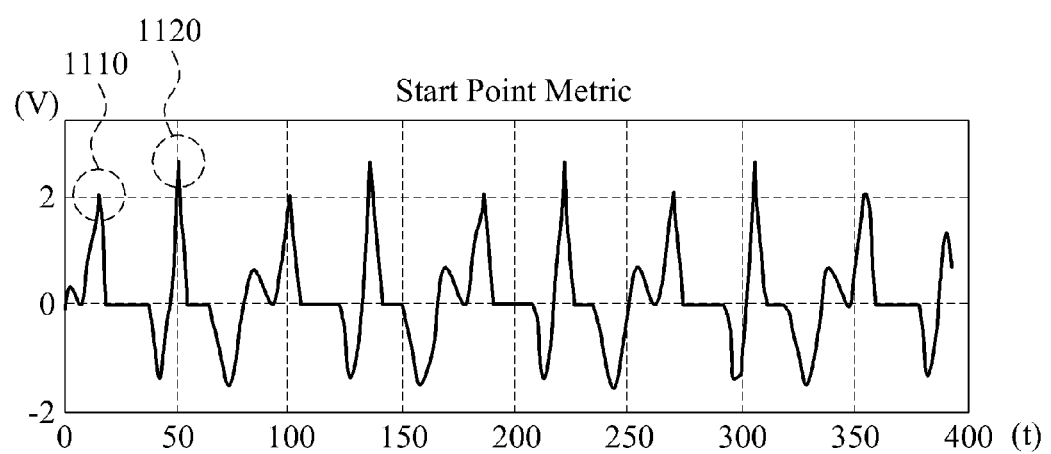

FIGS. 11A and 11B illustrate an example of a clipped envelope of a clipped signal, and an example of a result of adaptively adjusting a gap between two points used to calculate each slope, respectively, in a signal processing apparatus. Referring to a start point metric of FIG. 11B, a peak 1110 is sharp by adaptively adjusting a gap between two points of a slope, as described in the operation of FIGS. 10A and 10B. However, a peak 1120 still remains at an undesired point, and may be resolved through an operation of FIG. 12.

Figure 12:
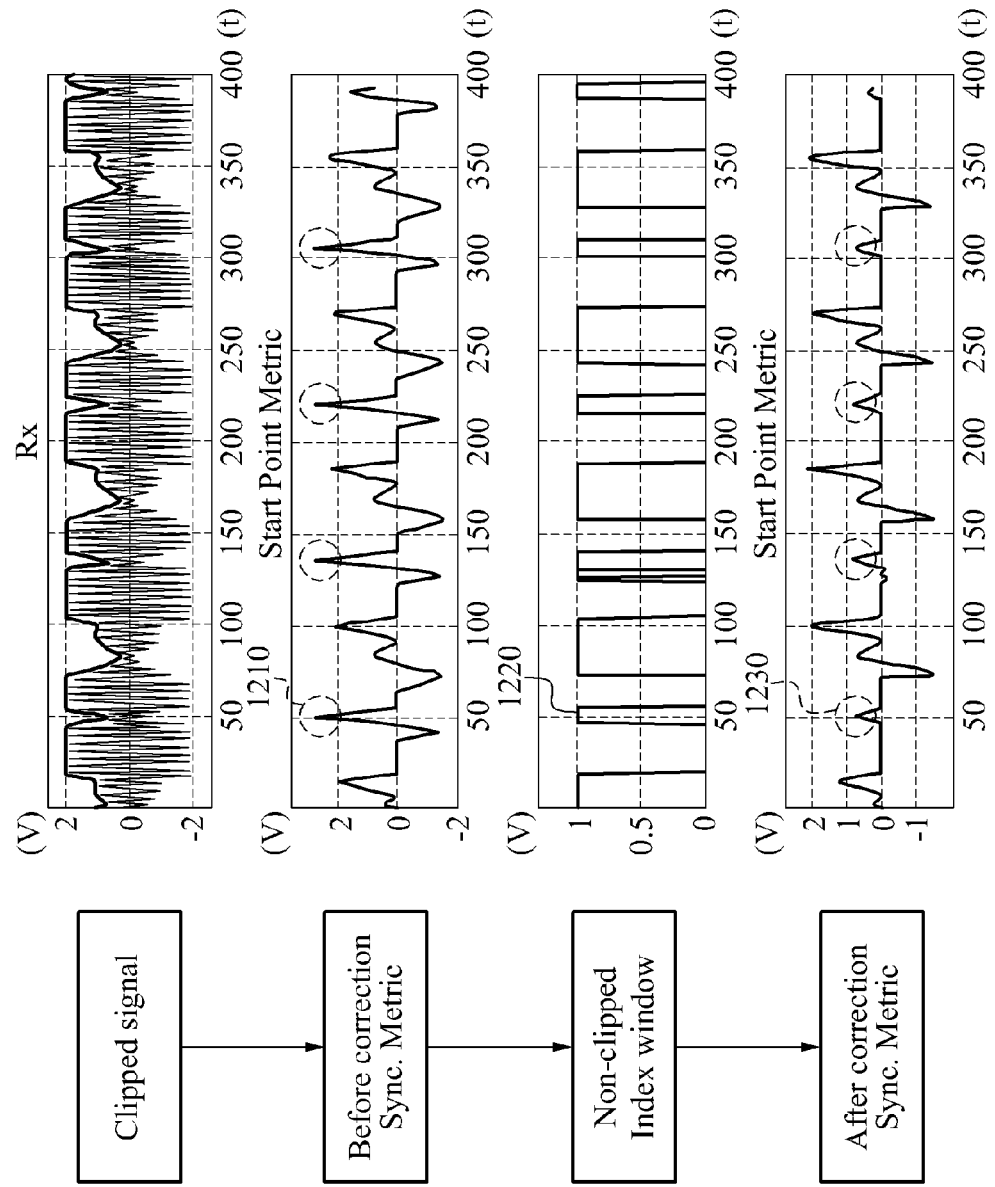
FIG. 12 is a diagram illustrating an example of an operation of restraining an undesired peak point using a non-clipped index window in a signal processing apparatus, in the examples of FIGS. 11A and 11B.

FIG. 12 illustrates an example of an operation of restraining an undesired peak point using a non-clipped index window in a signal processing apparatus, in the examples of FIGS. 11A and 11B. Referring to FIG. 12, a peak 1210 exists for each symbol of a start point metric or a synchronization metric. A value of the peak 1210 is reduced or corrected using a width 1220 of the non-clipped index window. For example, when the width 1220 of the non-clipped index window is used as a weight, and is multiplied by the peak 1210, the value of the peak 1210 is reduced to a value of a peak 1230 in a corrected start point metric or a corrected synchronization metric. The non-clipped index window may include a window sequence in which a clipping interval and a non-clipping interval in a clipped signal include values of '0' and '1', respectively.

Since the peak 1210 typically occurs in a short interval between clipping intervals, the value of the peak 1210 is offset by applying the width 1220 of the non-clipped index window as the weight. The non-clipped index window may include various shapes, for example, a pulse, a window, and/or other shapes known to one of ordinary skill in the art. The non-clipped index window is an example of a non-clipping interval. Accordingly, any of shapes representing a non-clipping interval may be applied as a weight.

Figure 13:
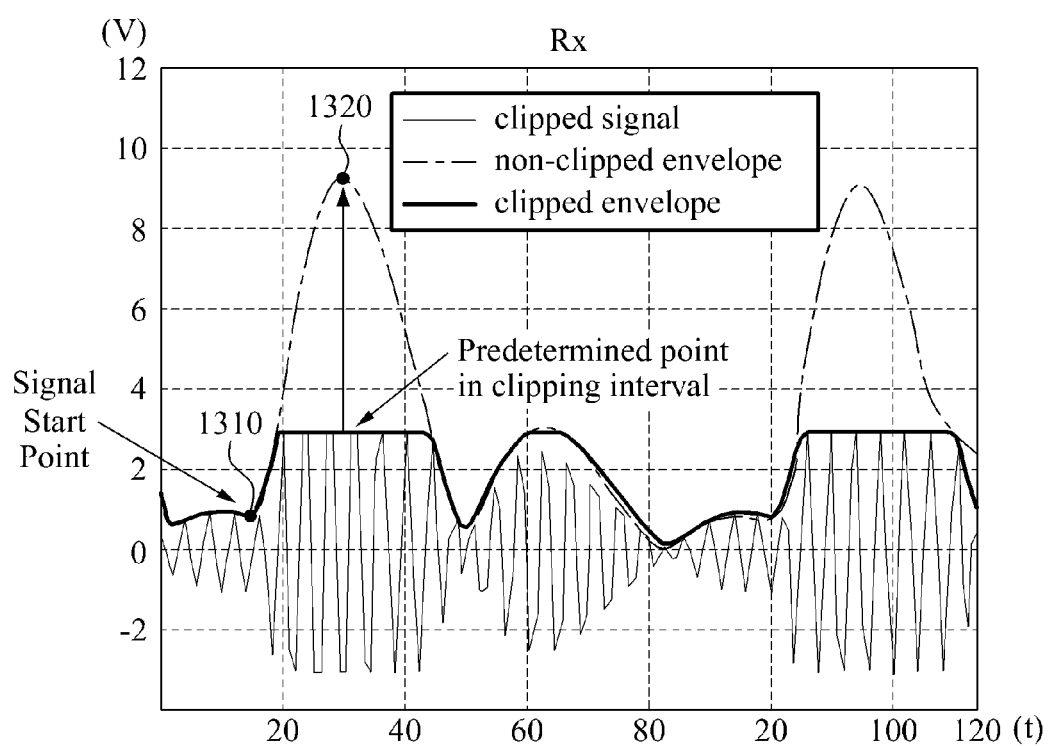
FIG. 13 is a graph illustrating an example of a peak point estimated by a signal processing apparatus.

FIG. 13 illustrates an example of a peak point estimated by a signal processing apparatus. Referring to FIG. 13, when a slope is calculated from a clipped envelope of a clipped signal, a point 1310, of the clipped envelope, including a maximum value of the slope is estimated as a signal start point of a mutual resonance between a source resonator and a target resonator. A peak point 1320, of a non-clipped envelope, including a peak amplitude value is estimated at a predetermined point of the non-clipped envelope in a clipping interval.

For example, the peak point 1320 may occur at a point corresponding to a middle of the clipping interval, or at a point that is earlier than the point corresponding to the middle of the clipping interval. Accordingly, the signal processing apparatus may estimate the peak point 1320 at the middle of the clipping interval, or at a point that is earlier by a predetermined point in time than the point corresponding to the middle of the clipping interval.

Figure 14:
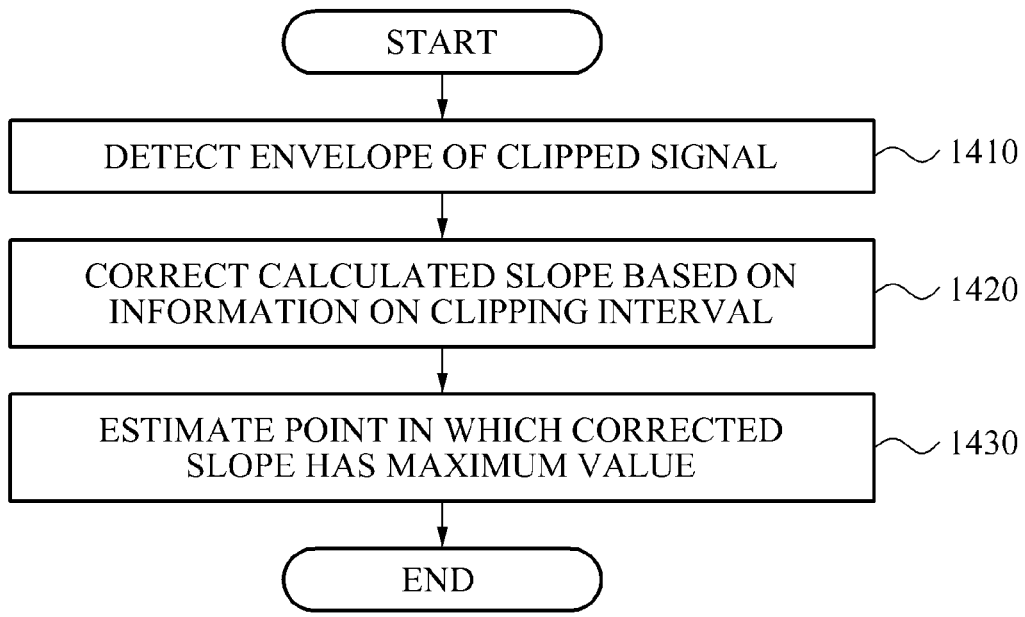
FIG. 14 is a flowchart illustrating an example of a signal processing method.

FIG. 14 illustrates an example of a signal processing method. Referring to FIG. 14, in operation 1410, a signal processing apparatus detects an envelope of a clipped signal. In more detail, the signal processing apparatus estimates the envelope of an input signal clipped by a dynamic range of an ADC, and clips an amplitude value of the estimated envelope in a clipping interval, to a clipping level corresponding to the dynamic range of the ADC. The dynamic range of the ADC may be set to be narrower than an amplitude of the input signal. The signal processing apparatus may detect the envelope for each symbol, e.g., duration of time, and the input signal may include a waveform of energy stored in a target resonator, through mutual resonance between a source resonator and the target resonator.

In operation 1420, the signal processing apparatus corrects at least one slope calculated in points of the detected envelope based on information on the clipping interval. In more detail, the signal processing apparatus calculates slopes, each of which is between two points including a predetermined gap of the detected envelope, and may adaptively adjust a predetermined gap between two points used to calculate a slope, based on the information on the clipping interval, to correct each of the calculated slopes. Additionally, the signal processing apparatus may set a length of a non-clipping interval as a weight, and may apply the length of the non-clipping interval to the calculated slopes, to correct the calculated slopes.

In operation 1430, the signal processing apparatus estimates a point in which a corrected slope has a maximum value. In more detail, the signal processing apparatus may estimate a point, of the detected envelope, corresponding to a maximum slope, among the corrected slopes, based on a result of the application of the weight to the calculated slope. The signal processing apparatus estimates the point at which the corrected slope includes the maximum value, as a start point of a mutual resonance between the source resonator and the target resonator.

According to the teachings above, there is provided a method of setting a dynamic range of an ADC to be narrower than an amplitude of an input signal, which makes it possible to estimate an envelope from a clipped signal, and to estimate a peak point and a point including a maximum slope, of the estimated envelope, based on information on a clipping interval in the estimated envelope. The peak point includes a point at which the estimated envelope includes a maximum amplitude in an example in which clipping of the envelope does not occur, e.g., in the non-clipped envelope.

Additionally, in a RI system in which power is wirelessly exchanged between a source resonator and a target resonator, the estimated point including the maximum slope is estimated as a start point of a mutual resonance between the source resonator and the target resonator, based on the input signal, which may include a waveform of energy received by the target resonator. Thus, it is possible to perform time synchronization between the source resonator and the target resonator.

Furthermore, by using the dynamic range of the ADC that is narrower than the amplitude of the input signal, it is possible to reduce power consumption of a receiver. Moreover, it is possible to perform time synchronization between a source resonator and a target resonator that are relatively far away from each other, despite the ADC including the same resolution as that of a conventional ADC being used.

The units described herein may be implemented using hardware components, software components, or a combination thereof. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more computer readable recording mediums. The computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices. Also, functional programs, codes, and code segments accomplishing the examples disclosed herein can be easily construed by programmers skilled in the art to which the examples pertain based on and using the flow diagrams and block diagrams of the figures and their corresponding descriptions as provided herein.

As a non-exhaustive illustration only, a device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A signal processing apparatus comprising:
   an envelope detecting unit configured to detect an envelope of an input signal;
   a correcting unit configured to correct slopes, each of the slopes being between respective points of the envelope, based on information on a clipping interval of the envelope; and
   an estimating unit configured to estimate a point, of the envelope, in which a corrected slope, among the corrected slopes, comprises a maximum value.

2. The signal processing apparatus of claim 1, wherein the envelope detecting unit comprises:
   an envelope estimator configured to estimate the envelope of the input signal, the input signal being clipped by a dynamic range of an analog-to-digital converter (ADC), and the dynamic range being set to be narrower than an amplitude of the input signal; and
   a clipping unit configured to clip an amplitude of the estimated envelope in the clipping interval, to a clipping level corresponding to the dynamic range.

3. The signal processing apparatus of claim 1, wherein the envelope detecting unit comprises:
   an information acquiring unit configured to acquire the information on the clipping interval.

4. The signal processing apparatus of claim 1, wherein the correcting unit comprises:
   a slope calculating unit configured to calculate the slopes, each of the slopes being between two respective points comprising a predetermined gap, of the envelope.

5. The signal processing apparatus of claim 4, wherein the correcting unit further comprises:
   a gap adjusting unit configured to adaptively adjust the predetermined gap between the two respective points of each of the respective calculated slopes, based on the information on the clipping interval.

6. The signal processing apparatus of claim 5, wherein the gap adjusting unit is configured to:
   adjust the predetermined gap between the two respective points of each of the respective calculated slopes to be greater than or equal to another predetermined gap.

7. The signal processing apparatus of claim 1, wherein the correcting unit comprises:
   a weight applying unit configured to apply a length of a non-clipping interval of the envelope to the slopes.

8. The signal processing apparatus of claim 7, wherein the estimating unit is configured to:
   estimate the point, of the envelope, in which the corrected slope, among the corrected slopes, comprises the maximum value based on a result of the application of the length of the non-clipping interval to the slopes.

9. The signal processing apparatus of claim 1, wherein the estimating unit comprises:
a peak point estimator configured to estimate, for each symbol, a peak point comprising a maximum amplitude of the envelope in the clipping interval.

10. The signal processing apparatus of claim 9, further comprising:
a control unit configured to control a target resonator to transfer power stored in the target resonator through a mutual resonance between a source resonator and the target resonator when the peak point is estimated.

11. The signal processing apparatus of claim 1, wherein:
the input signal is clipped by a dynamic range of an ADC for each symbol;
the input signal comprises a waveform of power stored in a target resonator through a mutual resonance between a source resonator and the target resonator;
the dynamic range is set to be narrower than an amplitude of the waveform; and
the point comprises a start point of the mutual resonance.

12. The signal processing apparatus of claim 1, wherein the input signal comprises a waveform of a current applied to a target resonator, or a waveform of a voltage applied to the target resonator.

13. The signal processing apparatus of claim 1, further comprising:
a control unit configured to control a target resonator to receive power through a mutual resonance between a source resonator and the target resonator when the point is estimated.

14. The signal processing apparatus of claim 1, wherein the envelope detecting unit comprises:
a down-converting unit configured to multiply a predetermined signal of a resonance frequency by the input signal, to generate a down-converted signal, the input signal being ADC-sampled in a dynamic range;
a transforming unit configured to perform discrete Fourier transform (DFT) or fast Fourier transform (FFT) on the down-converted signal, to transform the down-converted signal to a frequency-domain signal;
a filtering unit configured to perform low-pass filtering (LPF) on the frequency-domain signal, to generate a filtered signal from which a harmonic component is removed;
an inverse-transforming unit configured to perform inverse DFT (IDFT) or inverse FFT (IFFT) on the filtered signal, to transform the filtered signal to a time-domain signal; and
a clipping unit configured to clip an amplitude of the time-domain signal in the clipping interval, to a clipping level corresponding to the dynamic range.

15. The signal processing apparatus of claim 1, wherein the envelope detecting unit comprises:
a transforming unit configured to perform DFT or FFT on the input signal, to transform the input signal to a frequency-domain signal, the input signal being ADC-sampled in a dynamic range;
a circular shift unit configured to circularly shift the frequency-domain signal by a predetermined frequency, to generate a circularly-shifted signal;
a filtering unit configured to perform LPF on the circularly-shifted signal, to generate a filtered signal from which a harmonic component is removed;
an inverse-transforming unit configured to perform IDFT or IFFT on the filtered signal, to transform the filtered signal to a time-domain signal; and
a clipping unit configured to clip an amplitude of the time-domain signal in the clipping interval, to a clipping level corresponding to the dynamic range.

16. A signal processing method comprising:
detecting an envelope of an input signal;
correcting slopes, each of the slopes being between respective points of the envelope, based on information on a clipping interval of the envelope; and
estimating a point, of the envelope, in which a corrected slope, among the corrected slopes, comprises a maximum value.

17. The signal processing method of claim 16, wherein:
the input signal is clipped by a dynamic range of an analog-to-digital converter (ADC);
the dynamic range is set to be narrower than an amplitude of the input signal; and
the detecting comprises clipping an amplitude of the envelope in the clipping interval, to a clipping level corresponding to the dynamic range.

18. The signal processing method of claim 16, wherein the correcting comprises:
calculating the slopes, each of the slopes being between two respective points comprising a predetermined gap in the envelope;
adaptively adjusting the predetermined gap between the two respective points of each of the respective calculated slopes based on the information on the clipping interval; and
applying a length of a non-clipping interval of the envelope to the calculated slopes.

19. The signal processing method of claim 18, wherein the estimating comprises:
estimating the point, of the envelope, in which the corrected slope, among the corrected slopes, comprises the maximum value based on a result of the applying of the length of the non-clipping interval to the calculated slopes.

20. The signal processing method of claim 16, wherein:
the input signal is clipped by a dynamic range of an ADC for each symbol;
the input signal comprises a waveform of power stored in a target resonator through a mutual resonance between a source resonator and the target resonator;
the dynamic range is set to be narrower than an amplitude of the waveform; and
the point comprises a start point of the mutual resonance.

\* \* \* \* \*